United States Patent [19]

Nebel

[11] Patent Number: 4,907,249

[45] Date of Patent: Mar. 6, 1990

[54] AUTOMATIC OFF/ON CIRCUIT FOR MONITORING DATA RECEIVING AND STORING DEVICES

[76] Inventor: Paul R. Nebel, 4177 S. 2nd St., Milwaukee, Wis. 53207

[21] Appl. No.: 221,604

[22] Filed: Jul. 20, 1988

[51] Int. Cl.⁴ .............................................. H04B 1/10
[52] U.S. Cl. ..................................... 375/104; 455/231
[58] Field of Search ......................... 375/10, 104, 94; 455/212, 218, 219, 220, 221, 222, 223, 224, 225, 312, 231; 307/64

[56] References Cited

U.S. PATENT DOCUMENTS

| | | | |
|---|---|---|---|
| 3,852,671 | 12/1974 | Risley | 455/218 |
| 3,979,679 | 9/1976 | Bush et al. | 455/218 |
| 4,344,175 | 8/1982 | Leslie | 375/94 |
| 4,479,153 | 10/1984 | Kahn | 455/221 |
| 4,479,251 | 10/1984 | Dawson | 455/223 |
| 4,688,265 | 8/1987 | Chemelewski | 455/223 |
| 4,751,580 | 6/1988 | Fitzgerald et al. | 307/64 |

OTHER PUBLICATIONS

Black Box Timer Brochure (No. MCOLL-985 4 Pages).

*Primary Examiner*—Benedict V. Safourek
*Assistant Examiner*—Stephen Chin
*Attorney, Agent, or Firm*—Joseph S. Heino

[57] ABSTRACT

An automatic off/on circuit for monitoring data receiving devices which turns the power to such devices "off" when data is not received for a first preset period of time and which turns the power to such devices "on" after a second preset period of time to restore reception of transmitted data.

8 Claims, 2 Drawing Sheets

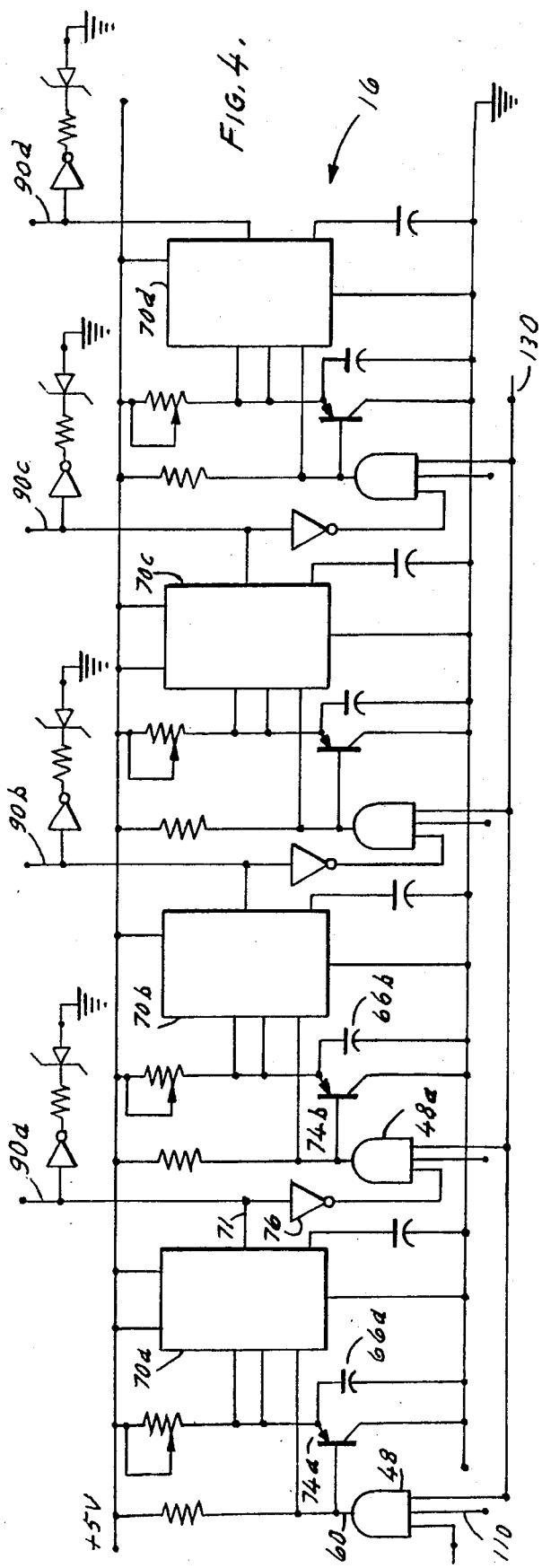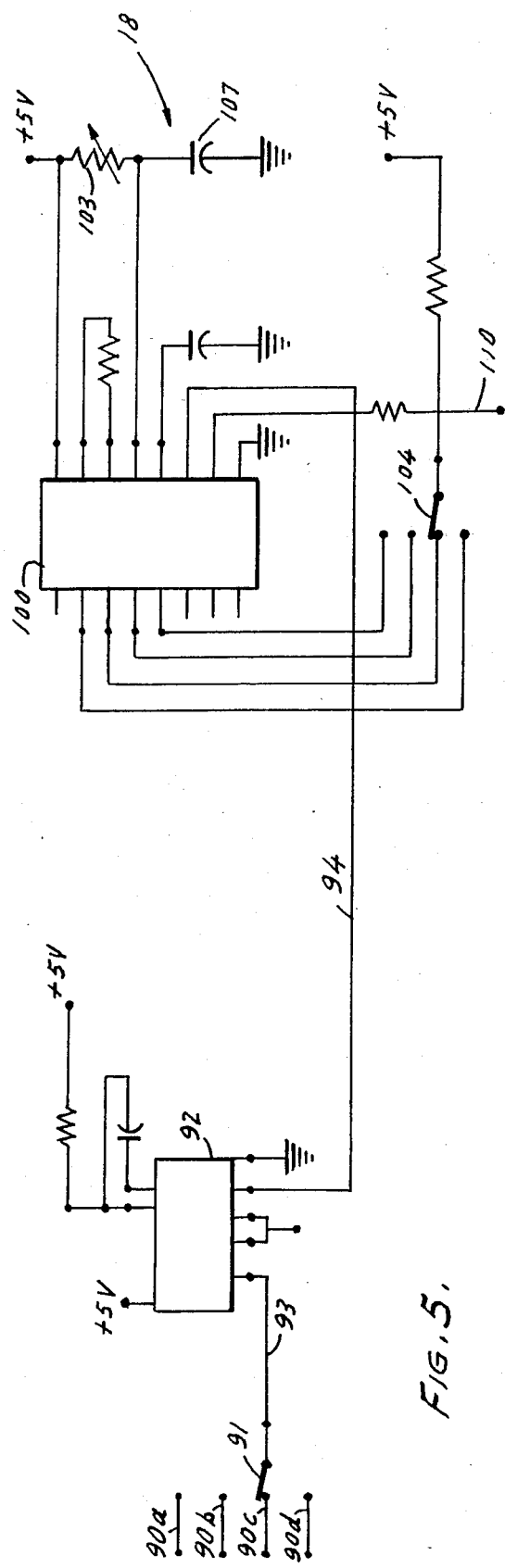

AUTOMATIC OFF/ON CIRCUIT FOR MONITORING DATA RECEIVING AND STORING DEVICES

SUMMARY OF THE INVENTION

This invention relates to circuits for monitoring data receiving and storing devices and more particularly to a circuit which turns the power to such devices "off" when data is not received or stored during a pre-determined period of time and which turns the power to such devices "on" to restore reception and storage of transmitted data.

There are many news wire services, investment institutions and other organizations which transmit data by use of a satellite network. Typically, each location which receives transmitted data includes a satellite data receiver, a modem and/or a printer. Often data is sent at night, on weekends or during other long periods of time when the receiving equipment is unattended. Because the receiving equipment typically employs sensitive digital circuitry, a surge in the A.C. line voltage, static electricity in the air, a temporary circuit malfunction, garbled data or an interruption of the transmitting source clock, for example, can cause the receiving equipment to "lock up". When this happens, the system is no longer receiving data. At some later point in time, the user may return to the receiving equipment to find that substantial amounts of data have not been received. The user can quite often restore the system back to proper operation by merely turning off the A.C. power to the data receiving device and turning it back on again. However, the user has lost that data which was transmitted between the time of the system "lock up" and the time the system is restored.

It is, therefore, a principal object of the present invention to provide an automatic off/on circuit for monitoring data receiving and storing devices which accomplishes the task of turning such devices off when data is not received or stored and turning them back on to restore reception and storage of transmitted data when the receiving system is unattended. It is another object of the present invention to provide the capability of monitoring proper operation of both electronic data receiving devices and data receiving printers by monitoring the received data electrical signals or by monitoring the noise generated by the printers, respectively. It is yet another object of the present invention to allow the user to preselect the period of time which is required before the data receiving device is turned off and to preselect the period of time desired before turning such devices back on so that the user can compensate for normal operating conditions. It is yet another object of the present invention to provide a monitoring circuit which is driven by a power source which is independent of and unaffected by the power source which drives the data receiver.

The circuit of the present invention has obtained these objects. It provides for a data sensing means, a timer and an electronic switch. The data sensing means is variably adjustable to allow the user to select between the sensing of electrical signals coming from the data receiver or noise produced by the printer or printers. The timer is set by the user to a predetermined period of time slightly longer than the period of time that the data circuit remains idle under normal conditions. Each time data moves over the data circuit, the loss of data timer is reset to zero. If the data receiver fails to receive data for the predetermined period of time specified by the user, the receiving equipment is shut down for another specified period of time. After this other specified period of time, power is restored to the receiving equipment and the timer is reset to zero. In many cases, this function will restore the system back to proper operation. If data is still not being received, however, the receiver will be shut down repeatedly for the specified time for each period of time during which the loss of data timer times out. The circuit of the present invention is also capable of being made operable by using a DC source voltage which can be independent of the AC source voltage which drives the data receiving device. The foregoing and other features of the circuit of the present invention will be further apparent from the description which follows.

BRIEF DESCRIPTION OF THE DRAWINGS

FIG. 4 is a circuit diagram of the first timing portion of the circuit of the present invention.

FIG. 5 is a circuit diagram of the second timing portion of the circuit of the present invention.

DETAILED DESCRIPTION

Figure 1:
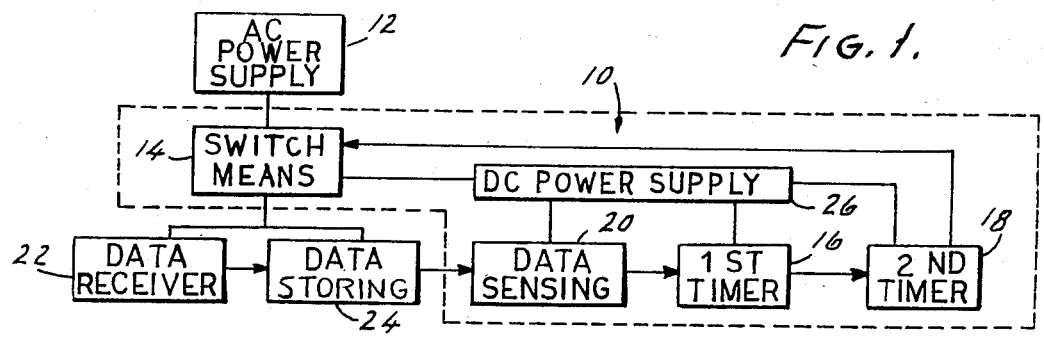
FIG. 1 is a schematic in block diagram form illustrating a satellite data receiving system which utilizes the circuit of the present invention.

Referring now to the drawings in detail, FIG. 1 schematically depicts the circuit of the present invention generally denoted by reference numeral 10 utilized with a typical satellite data receiving system. In the typical data receiving system, a power supply 12 supplying, electrical energy for example, at 60 Hz. and 110 VAC to AC loads is provided and coupled to a data receiver 22 and/or a data storing means 24. In accordance with the circuit of the present invention, a switch means 14 is interposed between the power supply 12 and the data receiver 22 and/or the data storing means 24. A data sensing means 20 is also provided for monitoring the data receiver 22 and/or data storing means 24. The data sensing means 20 and the other components of the circuit of the present invention 10 are supplied with electrical energy from a DC power supply 26. When the data receiver 22 and/or data storing means 24 are not receiving or storing data, respectively, the data sensing means 20 actuates a first timing means 16. If the data receiver 22 and/or data storing means 24 do not receive or store data during a preselected period of time, the first timing means 16 times out and changes the state of the second timing means 18 to its unstable state which turns the switch means 14 to its "off" position thereby disconnecting the data receiver 22 and data storing means 24 from the power supply 12. The second timing means 18 then begins to time out for a second preselected period of time. At the end of the second time period, the second timing means 18 changes to its stable state and the switch means 14 is actuated to the "on" position thereby restoring the electrical connection between the data receiver 22 and storing means 24 and the power supply 12.

Figure 3:
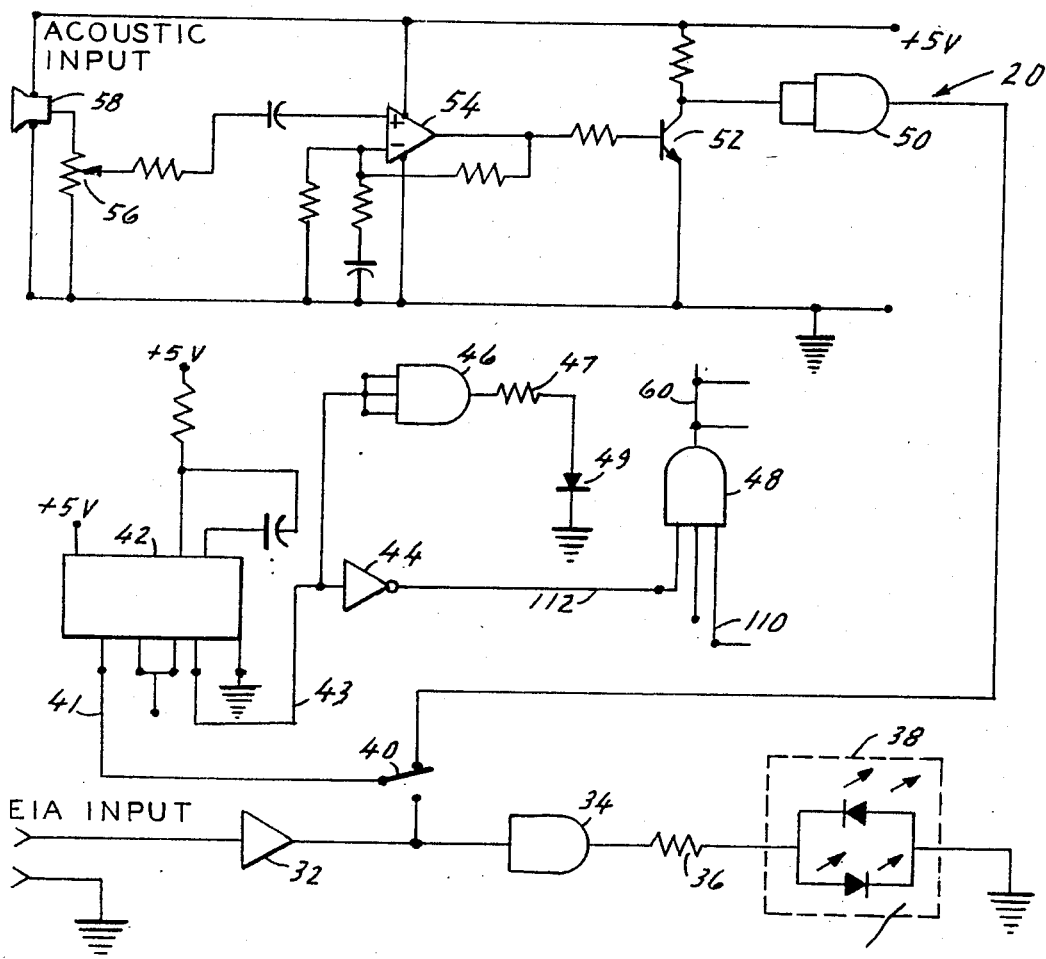
FIG. 3 is a circuit diagram of the data sensing portion of the circuit of the present invention.

Referring now to FIG. 3, a circuit diagram of the data sensing means 20 of the circuit of the present invention is illustrated. Since data may be received and stored through direct EIA input or be received and stored on a printer, a switch 40 is provided for selection between data sensing by EIA input mode or by acoustic input mode, respectively. In the EIA input mode, the EIA input is conducted to an EIA receiver 32 which is in turn coupled to a NAND gate 34 in series with a resistor 36 and a bicolor LED 38 for indicating reception of EIA input. When the switch 40 is placed in the acoustic input mode, an analog signal from the microphone 58, is conducted through a variable resistor 56 and amplified by an operational amplifier 54 and transistor 52. The microphone 58 is mechanically attached to or placed inside a printer so as to be in noise monitoring position relative to such data receiving printer. The variable resistor 56 can be adjusted to monitor a threshold noise level such that noise generated by a monitored data receiving printer is amplified but ambient room noise is not. The collector of the transistor 52 is coupled to the input of a Schmitt trigger 50 which converts the analog input from the microphone 58 to TTL pulses. With the variable resistor 56 adjusted to the threshold as previously described, trigger pulses occur in this portion of the circuit when the data receiving printer is operating but ambient room noise is ignored.

Depending upon the setting of the data sensing means switch 40, input to a pulse stretcher 42 through an input line 41 is made either by the TTL pulses coming from the Schmitt trigger 50 in the acoustic mode or by the TTL pulses coming from the EIA receiver 32 in the EIA input mode. When the pulse stretcher 42 senses a transition between the TTL voltage, typically between 0 and 5 volts, a pulse occurs at the output line 43 of the pulse stretcher 42 which is conducted to and inverted by an invertor 44. The voltage level at the output line 43 is monitored by use of an LED 49 which is coupled thereto through an AND gate 46 and resistor 47 in series. The output from the invertor 44 passes through a line 112 to the input of another AND gate 48 which has a second input line 110 and an output line 60.

Referring now to FIG. 4, the circuit diagram of the first timing portion 16 of the circuit of the present invention is illustrated. Each time a low voltage level is produced in the output line 60 of the sensing means AND gate 48, the low voltage level in that output line 60 turns the transistor 74a on. With the transistor 74a on, the capacitor 66a wired across it discharges and the input to the first counter 70a is kept at zero. If, on the other hand, the AND gate 48 is in a high voltage state for a long enough period of time, the AND gate 48 is turned off and the transistor 74a is likewise turned off, thereby charging the capacitor 66a in parallel with it and causing a trigger pulse across the first counter 70a. The first counter 70a is ganged to the second counter 70b. The signal from the first counter 70a passes from the output line 71, through an invertor 76 and into the next AND gate 48a in the second stage of the timer. In turn, a second charging and discharging circuit is provided through the transistor 74b and capacitor 66b which causes trigger pulses across the second counter 70b and so on. The same is true for the third and fourth counters 70c, 70d. The cascading circuits of the first timing means 16 thus provides variable settings for idle time during periods when no data is sensed as received. The variable setting times are determined by the settings at the output lines 90a, 90b, 90c, 90d of the counters 70a, 70b, 70c, 70d, respectively. As shown in FIG. 5, a wafer switch 91 is provided for preselecting between the various idle times at the output lines 90a, 90b, 90c, 90d of the counters 70a, 70b, 70c, 70d, respectively.

Referring more particularly to the circuit diagram illustrated in FIG. 5, the circuit of the second timing means 18 of the circuit of the present invention is shown. Depending upon which idle time the first timing means 16 is set for by the wafer switch 91, if the first timing means 16 times out for that preselected period of time, a low voltage appears at the input line 93 of the flip-flop 92. When that happens, a complete pulse appears at the output line 94 of the flip-flop 92. When that pulse occurs, the monostable flip-flop 100 is set to its not stable condition. The flip-flop 100 will stay in that condition for a predetermined period of time and a low voltage will appear on the output line 110 of the flip-flop 100.

Figure 2:
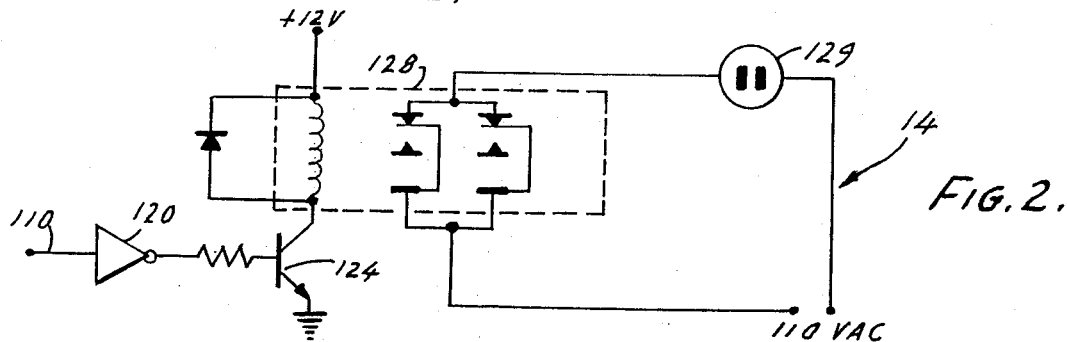
FIG. 2 is a circuit diagram of the switch means portion of the circuit of the present invention.

Referring now to FIG. 2, a circuit diagram of the switch means 14 of the circuit of the present invention is illustrated. The TTL level in line 110 is conducted through an invertor 120. If a low appears in line 110, the transistor 124 then turns on which causes the relay 128 to switch into its normally off position. The 110 VAC power supply is then turned off at the supply plug 129.

Referring again to the circuit diagram illustrated in FIG. 5, after the monostable flip-flop 100 times through its predetermined off period of time, as determined by the preselection of the second timing means switch 104 and by the values of the variable resistor 103 and of the capacitor 107, the circuit is again switched so that a low appears at the output line 110 of the flip-flop 100 which, in turn, produces a high at the input line 110 of the invertor 120 and turns the circuit back on to restore power. Also, while the flip-flop 100 was timing through, the counters 70a, 70b, 70c, 70d of the first timing means 16 were discharged and reset to zero. The first timing means 16 and the second timing means 18 will then be set back to zero and the sensing means 20 will again begin to monitor reception of data. If no data is received at this time, the first and second timing means 16, 18 will continue to time through over and over again until such time as data is received.

Although the invention has been described with reference to a particular embodiment, it will be understood to those skilled in the art that the invention is capable of a variety of alternative embodiments within the spirit and scope of the appended claims.

The principles of this invention having been fully explained in connection with the foregoing, I hereby claim as my invention:

1. A circuit for turning the electrical power to one or more data receiving and data storing devices "off" when data is not received by such devices for a first predetermined period of time and for turning the electrical power to such devices "on" to restore reception or storage of transmitted data after a second predetermined period of time, comprising:
   a first data sensing means for sensing when data is not received by said data receiving devices or for sensing when data is not being stored by said data storing devices;
   a second data sensing means for sensing when data is received by said data receiving devices or for sensing when data is being stored by said data storing devices;
   a first variable timing means for variably setting and timing the said first predetermined period of time during which the nonreceipt or the nonstorage of data is sensed by said first data sensing means;

a second variable timing means for variable setting and timing the said second predetermined period of time; and a switch means for switching off the power to said data receiving and said data storing devices when said first timing means times said first predetermined period of time and for switching on the power to said data receiving and said data storing devices when said second timing means times said second predetermined period of time.

2. The circuit of claim 1 wherein said first and second data sensing means comprise means for sensing an electrical output from and input to said data receiving devices and said data storing devices, respectively.

3. The circuit of claim 1 wherein said first and second data sensing means comprise means for sensing an acoustic output from said data storing devices.

4. The circuit of claim 1 wherein said data receiving and data storing devices are electrically powered by electrical energy derived from an AC voltage source and including a DC voltage source being electrically isolated from and independent of said AC voltage source wherein said first and second data sensing means, said first and second timing means, and said switch means are electrically powered from electrical power derived from said DC voltage source.

5. A circuit for monitoring a data receiving device and a data storing device which devices are electrically connected to a power supply and which circuit turns the power to such devices "off" when data is not received or stored during a period of time of sustained absence of data reception or data storage and which thereafter turns the power to such devices "on" to restore reception and storage of transmitted data, comprising:

switch means electrically connected between said power supply and said data receiving and said data storing devices, said switch means being electrically switchable between "on" and "off" electrical states to correspondingly transmit and not transmit said power to said data receiving device and to said data storing device for turning them "on" and "off";

means for concomitantly sensing the presence or absence of data received by said data receiving device and the storage or nonstorage of data by said data storing device, said sensing means being operable to produce electrical output signals when the absence of data reception or the nonstorage of data is sensed and when the presence of data reception and the storage of data is sensed; and timing means electrically connected between said sensing means and said switch means, said timing means being operable for receiving said electrical output signals from said sensing means for a first and a second preset period of time causing the switch means to switch to said "off" state after the first preset period of time of sustained absence of data reception or data storage and causing the switch means to switch to said "on" state after the second preset period of time after which data reception or data storage is restored.

6. The circuit of claim 5 wherein said data receiving device produces electrical output signals, said data storing device receives said data receiving device electrical output signals and said sensing means comprises input means for sensing the presence or absence of electrical output signals which are produced by said data receiving device and received by said data storing device.

7. The circuit of claim 5 wherein said data storing device produces acoustic output signals when it is storing data and said sensing means comprises means for sensing the presence or absence of acoustic output signals produced by said data storing device.

8. The circuit of claim 5 wherein said data receiving device and said data storing device are electrically powered by electrical energy derived from an AC voltage source and including a DC voltage source being electrically isolated from and independent of said AC voltage source wherein said switch means, said sensing means and said timing means are electrically powered by electrical energy derived from said DC voltage source.

* * * * *

UNITED STATES PATENT AND TRADEMARK OFFICE
CERTIFICATE OF CORRECTION

PATENT NO. : 4,907,249
DATED : March 6, 1990
INVENTOR(S) : Paul R. Nebel

It is certified that error appears in the above—identified patent and that said Letters Patent is hereby corrected as shown below:

In Claim 1, Column 4, line 52 of the Patent, after "received", insert -- or stored--.

In Claim 1, Column 5, line 1 of the Patent, change "variable", second occurrence, to --variably--.

Signed and Sealed this

Third Day of December, 1991

Attest:

HARRY F. MANBECK, JR.

Attesting Officer

Commissioner of Patents and Trademarks